United States Patent
Joo

(10) Patent No.: US 8,854,886 B2
(45) Date of Patent: Oct. 7, 2014

(54) MEMORY AND PROGRAM METHOD THEREOF

(75) Inventor: Seok-Jin Joo, Icheon-si (KR)

(73) Assignee: SK Hynix Inc., Gyeonggi-do (KR)

( * ) Notice: Subject to any disclaimer, the term of this patent is extended or adjusted under 35 U.S.C. 154(b) by 209 days.

(21) Appl. No.: 13/537,608

(22) Filed: Jun. 29, 2012

(65) Prior Publication Data

US 2013/0077403 A1 Mar. 28, 2013

(30) Foreign Application Priority Data

Sep. 22, 2011 (KR) .................. 10-2011-0095755

(51) Int. Cl.
*G11C 11/34* (2006.01)
*G11C 16/34* (2006.01)
*G11C 16/10* (2006.01)

(52) U.S. Cl.
CPC ........ *G11C 16/3418* (2013.01); *G11C 16/3459* (2013.01); *G11C 16/10* (2013.01)
USPC .................................................. 365/185.12

(58) Field of Classification Search
CPC . G11C 16/10; G11C 16/3459; G11C 16/3418
USPC ................................................... 365/185.12
See application file for complete search history.

(56) References Cited

U.S. PATENT DOCUMENTS

| 8,107,287 B2* | 1/2012 | Jung .................... 365/185.03 |
| 2008/0137415 A1* | 6/2008 | Lee ..................... 365/185.03 |
| 2009/0059660 A1* | 3/2009 | Lee et al. ............. 365/185.02 |
| 2010/0110798 A1* | 5/2010 | Hoei et al. ............ 365/185.24 |
| 2010/0195388 A1* | 8/2010 | Jung .................... 365/185.03 |
| 2010/0195397 A1* | 8/2010 | Hemink ................ 365/185.17 |
| 2010/0246271 A1* | 9/2010 | Sarin et al. ............ 365/185.19 |
| 2012/0075932 A1* | 3/2012 | Moschiano et al. ..... 365/185.19 |

FOREIGN PATENT DOCUMENTS

KR 1020070002344 A 1/2007
KR 1020080114386 A 12/2008

* cited by examiner

*Primary Examiner* — Huan Hoang
*Assistant Examiner* — Pablo Huerta
(74) *Attorney, Agent, or Firm* — William Park & Associates Patent Ltd.

(57) ABSTRACT

A method of programming a nonvolatile memory includes: applying a common program pulse to program cells within each page of a memory region including two or more pages; applying one or more different program pulses to the program cells within each page of the memory region, according to target threshold voltages of the program cells; and programming each page of the memory region such that the program cells have their own target threshold voltages.

19 Claims, 8 Drawing Sheets

FIG. 7

| WL0 | EVEN PAGE | ODD PAGE | |
|---|---|---|---|
| | 256 | 257 | EXACT PROGRAM |
| | 128 | 129 | SECOND SLIGHT PROGRAM |
| | 0 | 1 | FIRST SLIGHT PROGRAM |

| WL1 | EVEN PAGE | ODD PAGE | |
|---|---|---|---|
| | 258 | 259 | EXACT PROGRAM |
| | 130 | 131 | SECOND SLIGHT PROGRAM |
| | 2 | 3 | FIRST SLIGHT PROGRAM |

| WL2 | EVEN PAGE | ODD PAGE | |
|---|---|---|---|
| | 260 | 261 | EXACT PROGRAM |
| | 132 | 133 | SECOND SLIGHT PROGRAM |
| | 4 | 5 | FIRST SLIGHT PROGRAM |

| WL3 | EVEN PAGE | ODD PAGE | |
|---|---|---|---|
| | 262 | 263 | EXACT PROGRAM |
| | 134 | 135 | SECOND SLIGHT PROGRAM |
| | 6 | 7 | FIRST SLIGHT PROGRAM |

| WL4 | EVEN PAGE | ODD PAGE | |
|---|---|---|---|
| | 264 | 265 | EXACT PROGRAM |
| | 136 | 137 | SECOND SLIGHT PROGRAM |
| | 8 | 9 | FIRST SLIGHT PROGRAM |

⋮

| WL63 | EVEN PAGE | ODD PAGE | |
|---|---|---|---|
| | 382 | 383 | EXACT PROGRAM |
| | 254 | 255 | SECOND SLIGHT PROGRAM |
| | 126 | 127 | FIRST SLIGHT PROGRAM |

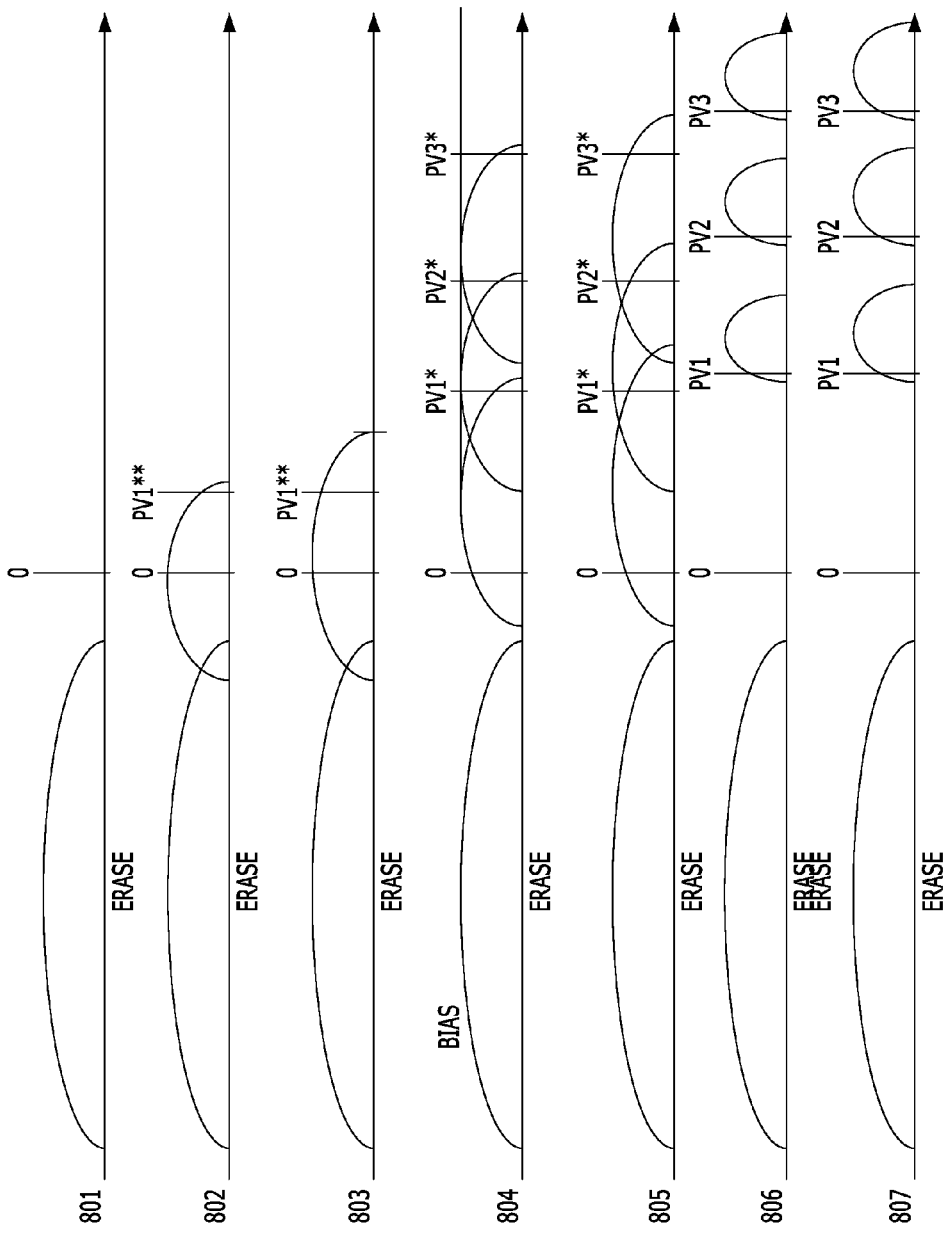

FIG. 9

| WL0 | EVEN PAGE | ODD PAGE | |
|---|---|---|---|
| | 10 | 11 | EXACT PROGRAM |
| | 4 | 5 | SECOND SLIGHT PROGRAM |
| | 0 | 1 | FIRST SLIGHT PROGRAM |

| WL1 | EVEN PAGE | ODD PAGE | |
|---|---|---|---|
| | 16 | 17 | EXACT PROGRAM |
| | 8 | 9 | SECOND SLIGHT PROGRAM |
| | 2 | 3 | FIRST SLIGHT PROGRAM |

| WL2 | EVEN PAGE | ODD PAGE | |
|---|---|---|---|
| | 22 | 23 | EXACT PROGRAM |
| | 14 | 15 | SECOND SLIGHT PROGRAM |
| | 6 | 7 | FIRST SLIGHT PROGRAM |

| WL3 | EVEN PAGE | ODD PAGE | |
|---|---|---|---|
| | 28 | 29 | EXACT PROGRAM |
| | 14 | 15 | SECOND SLIGHT PROGRAM |
| | 12 | 13 | FIRST SLIGHT PROGRAM |

| WL4 | EVEN PAGE | ODD PAGE | |
|---|---|---|---|
| | 34 | 35 | EXACT PROGRAM |
| | 26 | 27 | SECOND SLIGHT PROGRAM |
| | 18 | 19 | FIRST SLIGHT PROGRAM |

⋮

| WL63 | EVEN PAGE | ODD PAGE | |
|---|---|---|---|
| | 382 | 383 | EXACT PROGRAM |
| | 378 | 379 | SECOND SLIGHT PROGRAM |
| | 372 | 373 | FIRST SLIGHT PROGRAM |

MEMORY AND PROGRAM METHOD THEREOF

CROSS-REFERENCE TO RELATED APPLICATIONS

The present application claims priority to Korean Patent Application No. 10-2011-0095755, filed on Sep. 22, 2011, which is incorporated herein by reference in its entirety.

BACKGROUND

1. Field of the Invention

Embodiments of the present invention relate generally to a memory device and more particularly to a method of programming the memory device.

2. Description of the Related Art

Types of memory devices may be divided into volatile and nonvolatile memory devices depending on whether data stored therein is maintained when a power supply is cut off. A volatile memory device loses its data when the power supply is cut off, and includes DRAM and SRAM. A nonvolatile memory device maintains data even though the power supply is cut off, and includes a flash memory.

FIG. 1 is a diagram illustrating one block in a conventional nonvolatile memory device.

Referring to FIG. 1, the memory block includes a plurality of cell strings 110 to 160. Each of the cell strings 110 to 160 includes a plurality of memory cells, a drain selection transistor, and a source selection transistor. The plurality of memory cells are controlled by a plurality of word lines WL0 to WL63, respectively. The drain selection transistor uses a drain selection line DSL to electrically couple the cell strings 110 to 160 to bit lines BLe_0 to BLe_N and BLo_0 to BLo_N. The source selection transistor uses a source selection line SSL to electrically couple the cell strings 110 to 160 to a common source line CSL.

Memory cells controlled by one word line are divided into an even page corresponding to the even bit lines BLe_0 to BLe_N and an odd page corresponding to the odd bit liens BLo_0 to BLo_N. That is, memory cells controlled by the same word line and corresponding to the even bit lines BLe_0 to BLe_N form one even page, and memory cells controlled by the same word line and corresponding to the odd bit lines BLo_0 to BLo_N form one odd page. In FIG. 1, since a total of 64 word lines WL0 to WL63 exist, one memory block includes 64 even pages and 64 odd pages. Depending on the configuration of a memory block, even pages and odd pages may not be discriminated.

In general, the operation of a nonvolatile memory device includes a read operation of reading stored data, an erase operation of erasing stored data, and a program operation of storing data. The erase operation is performed in memory block units, and the read operation and the program operation are performed in page units.

FIG. 2 is a diagram illustrating a conventional single page program method.

Referring to FIG. 2, a program command and an address are applied to a memory at step S210, and program data corresponding to a single page is loaded into a page buffer at step S220. Then, a program pulse is applied to program memory cells within a page selected by the address at step S230, and whether threshold voltages of the program memory cells within the page reaches a target threshold voltage is verified at step S240. According to the verification result, if the threshold voltages of all the cells reached the target threshold voltage, the program operation is ended. Otherwise, a program pulse is reapplied at step S250. Once the threshold voltages of all the cells have reached the target threshold voltage, the program operation for one page is ended, and a program operation for the next page is performed.

In the single page program method, after a program operation for one page is completed, a program operation for the next page is performed. However, coupling and interference occur between memory cells. Accordingly, when a memory cell is programmed, the threshold voltages of memory cells around the memory cell may be changed. For example, during a program operation of a page corresponding to the word line WL3, the threshold voltages of memory cells within pages corresponding to the word lines WL2 and WL4 may also change. When such a phenomenon is accumulated, data stored in the memory cells may be changed. As a result, the reliability of the memory may be significantly reduced.

In order to overcome such a problem of the single page program method, Korean Patent Laid-open Publication No. 2008-0114386 and so on have proposed a multi-page program method which sequentially program a plurality of pages little by little. In this method, however, because the respective pages are programmed little by little, a time required for the program operation drastically increases. Therefore, it is not easy or efficient to apply the multi-page program method to an actual memory.

SUMMARY

An embodiment of the present invention is directed to a memory and a program method thereof, which is capable of reducing a time required for a program operation, while minimizing a threshold voltage change between neighboring memory cells caused by coupling or interference during the program operation.

In accordance with an embodiment of the present invention, a method of programming a nonvolatile memory includes: applying a common program pulse to program cells within each page of a region including two or more pages; applying one or more different program pulses to the program cells within each page of the region, according to target threshold voltages of the program cells; and programming each page of the region such that the program cells have their own target threshold voltages.

The program cells may have reached lower threshold voltages than their own target threshold voltages, after the applying of the common program pulse and the applying of the one or more different program pulses are completed. In the applying of the one or more different program pulses, a program cell having a high target threshold voltage may receive a larger variety of program pulses than a program cell having a low target threshold voltage. Furthermore, in the applying of the one or more different program pulses, a program cell having a high target threshold voltage may receive a higher program pulse than a program cell having a low target threshold voltage.

In accordance with another embodiment of the present invention, a method of programming a nonvolatile memory includes: programming program cells within each page of a region including two or more pages to a lower voltage level than a target threshold voltage; and programming each page of the region such that the program cells have the target threshold voltage. The programming of the program cells is performed until a predetermined number of memory cells among the program cells within a page are programmed to a lower voltage level than the target threshold voltage, where the predetermined number is less than all memory cells comprising the page.

In the programming of the program cells, a common program pulse may be applied to the program cells or one or more different program pulses may be applied to the program cells depending on target threshold voltages of the program cells.

In accordance with yet another embodiment of the present invention, a nonvolatile memory includes: a memory block comprising a plurality of pages; and one or more circuits configured to program the memory block. The one or more circuits apply a common program pulse to program cells within each of two or more pages within the memory block, apply one or more different program pulses to the program cells within each of the two or more pages depending on target threshold voltages of the program cells, and program the program cells within each of the two or more pages such that the program cells have their own target threshold voltages.

In accordance with still another embodiment of the present invention, a nonvolatile memory includes: a memory block comprising a plurality of pages; and one or more circuits configured to program the memory block. The one or more circuits program a predetermined number of program cells within each of two or more pages to reach a reference threshold voltage and a target threshold voltage, where the reference threshold voltage is less than the target threshold voltage, and where the predetermined number of cells is less than a total number of cells comprising a page of the two or more pages.

BRIEF DESCRIPTION OF THE DRAWINGS

FIG. 7 is a table showing a process in which pages within a memory block selected through the first slight program S400, the second slight program S500, and the exact program S600 are programmed;

FIG. 8 is a graph showing changes in the threshold voltages of memory cells within even pages of a word line WL0 through the program process as shown in FIG. 7; and FIG. 9 is a table showing a program order different from FIG. 7.

DETAILED DESCRIPTION

Figure 1:
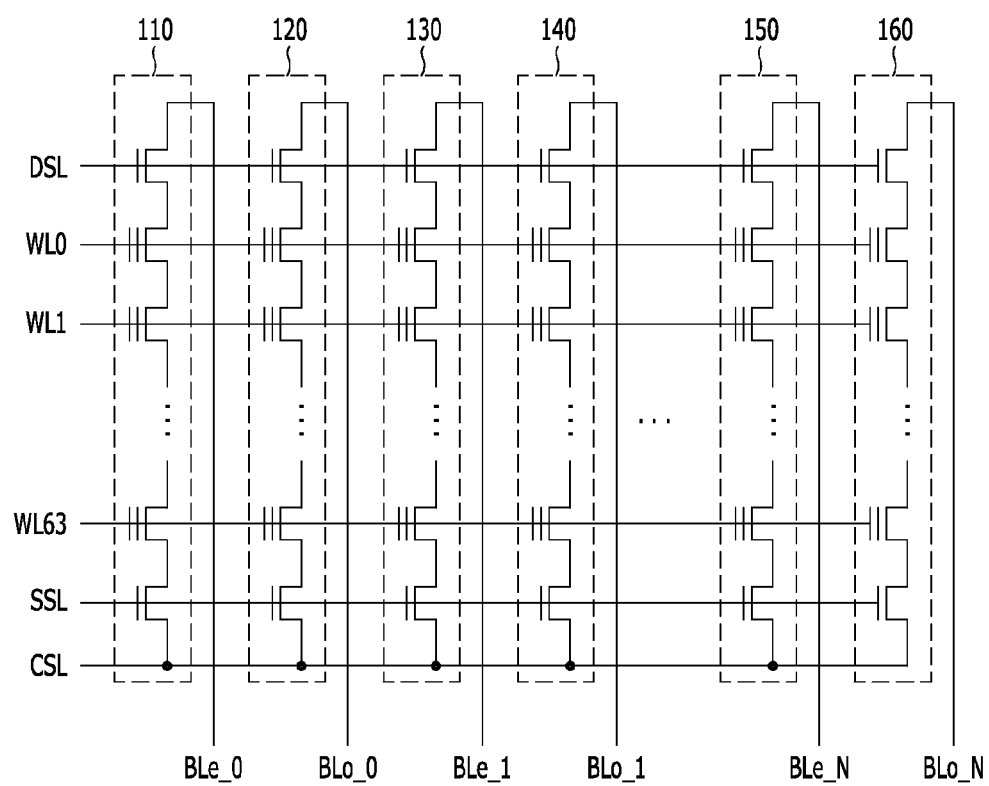
FIG. 1 is a diagram illustrating one block in a conventional nonvolatile memory device.
Figure 2:
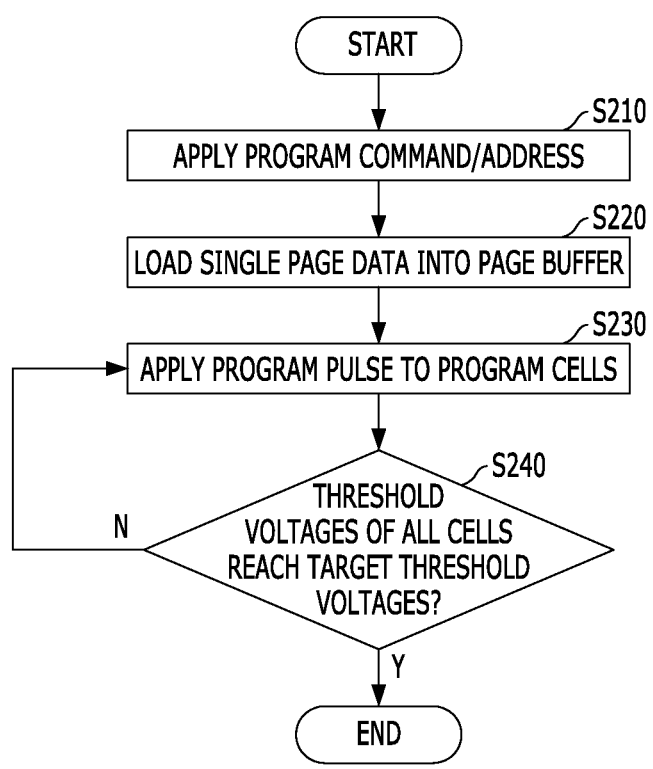
FIG. 2 is a diagram illustrating a conventional single page program method.

Embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough, and will fully convey the scope of the present invention to those skilled in the art. Throughout the disclosure, like reference numerals refer to like parts throughout the various figures and embodiments of the present invention.

Figure 3:
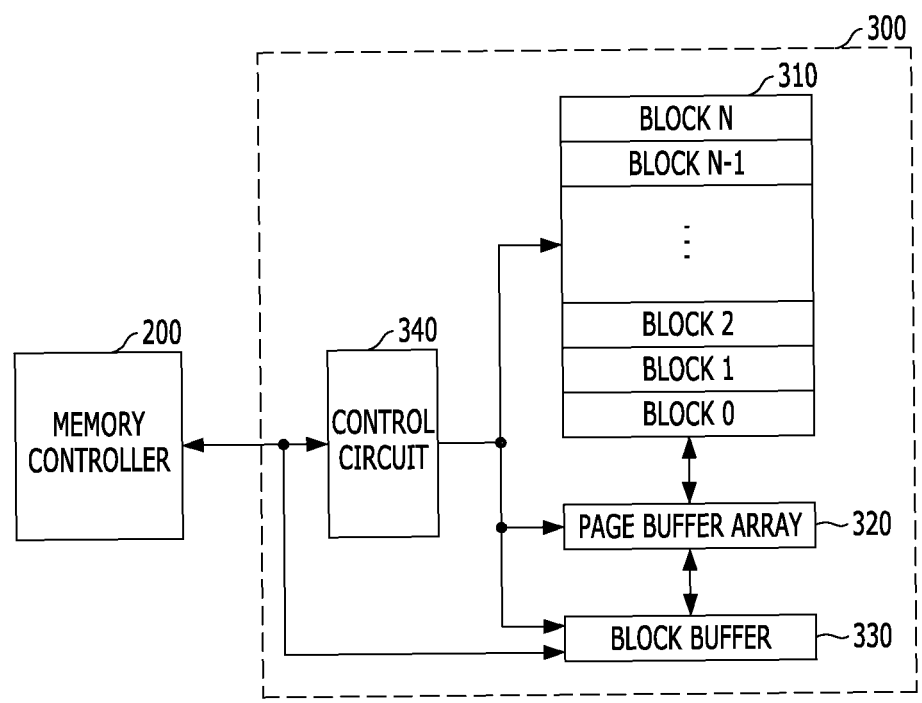
FIG. 3 is a configuration diagram of a nonvolatile memory system in accordance with an embodiment of the present invention.

FIG. 3 is a configuration diagram of a nonvolatile memory system in accordance with an embodiment of the present invention.

Referring to FIG. 3, the nonvolatile memory system includes a nonvolatile memory 300 and a memory controller 200.

The memory controller 200 is configured to apply read, erase, and program commands to a nonvolatile memory, in response to various control signals and commands inputted from a host.

The nonvolatile memory 300 includes a plurality of memory blocks 310, a page buffer array 320, a block buffer 330, and a control circuit 340.

Each of the memory blocks 310 includes a plurality of pages, and each of the pages includes a plurality of memory cells. Each of the memory cells may store multi-bit data.

The block buffer 330 is configured to temporarily store data which are to be programmed into a memory block selected from the plurality of memory blocks. Since block-unit data are temporarily stored in the block buffer 330, a program operation based on a multi-page method may be performed.

The page buffer array 320 is configured to receive data in page units from the block buffer 330, and transmit the received data to a selected page so that the data may be programmed into a memory block.

The control circuit 340 is a circuit for internal control of the nonvolatile memory. The control circuit 340 is configured to control the plurality of memory blocks 310, the page buffer array 320, and the block buffer 330 to enable a program operation which will be described below.

In an embodiment of the present invention, three kinds of program operations including a first slight program, a second slight program, and an exact program are performed. Hereafter, the operations will be described.

First, levels of various voltages to be mentioned below will be described.

PV1 may be a target threshold voltage level corresponding to a lowest level among target threshold voltages of program cells.

PV2 may be a target threshold voltage level corresponding to an intermediate level among the target threshold voltages of the program cells.

PV3 may be a target threshold voltage level corresponding to a highest level among the target threshold voltages of the program cells.

PV1* may be a reference threshold voltage level during the second slight program operation of a program cell having the target threshold voltage PV1 as a target threshold voltage.

PV2* may be a reference threshold voltage level during the second slight program operation of a program cell having the target threshold voltage PV2 as a target threshold voltage.

PV3* may be a reference threshold voltage level during the second slight program operation of a program cell having the target threshold voltage PV3 as a target threshold voltage.

PV1** may be a reference threshold voltage level during the first slight program operation of all program cells.

PV0_PGM_PULSE may be a level of a program pulse applied to a gate of a program cell during the first slight program operation (the level gradually increases from an initial value depending on an incremental step pulse programming (ISPP) method).

PV1_PGM_PULSE, PV2_PGM_PULSE, and PV3_PGM_PULSE may be levels of a program pulse applied to a gate of a program cell during the second slight program operation (the levels gradually increase from an initial value depending on the ISPP method).

The above-described voltages have the following relationship:

(PV1**≤PV1*≤PV1), (PV2*≤PV2), (PV3*≤PV3), (initial value of PV0_PGM_PULSE<initial value of PV1_PGM_PULSE<initial value of PV2_PGM_PULSE<initial value of PV3_PGM_PULSE), and (voltage difference among PV1_PGM_PULSE, PV2_PGM_PULSE, and PV3_PGM_PULSE is substantially similar to voltage difference among PV1, PV2, and PV3).

1. First Slight Program

The first slight program is a program operation which increases a threshold voltage of a memory cell to the level of the reference threshold voltage PV1** which is lower than the final target threshold voltages PV1, PV2, and PV3. During the first slight program operation, only whether memory cells within a page are program cells or erase cells is discriminated (i.e., erase cells within the page may be inhibited), and the same program pulse PV0_PGM_PULSE is applied to the program cells.

During the first slight program operation, verification is completed when a predetermined number of program cells among the program cells within the page approach the threshold voltage level PV1**. Here, the predetermined number of program cells corresponds to 1/10 of the number of entire memory cells within the page. In other examples, the predetermined number may be set to one in the range of 1 to 100. During a general program operation, verification is completed only when the threshold voltages of all program cells have reached a predetermined level (i.e., a target threshold voltage level). During the first slight program operation, however, verification is completed when only the threshold voltages of a small number of program cells reach the predetermined level. The first slight program is not a program operation which is to increase the threshold voltages of program cells to the target threshold voltages PV1, PV2, and PV3, but a program operation which slightly increases the threshold voltages of the program cells. Therefore, the verification in the first slight program may be omitted.

In order to reduce an operation time of the first slight program, an increasing step of the program pulse PV0_PGM_PULSE may be set to a large value, and after the program pulse PV0_PGM_PULSE is applied several times or more, the first slight program operation may be ended.

That is, the first slight program is a program operation having the following characteristics. (A) The first slight program is a program operation which slightly increases the threshold voltages of program cells. (B) Only whether memory cells are program cells or erase cells is discriminated, what are the target threshold voltages of the program cells is not considered, and a common program pulse PV0_PGM_PULSE is applied to the program cells. (C) Verification is completed when the threshold voltages of a predetermined number of program cells (for example, 50 program cells) among the program cells within the page reach the reference threshold voltage level PV1** or verification is omitted.

Figure 4:
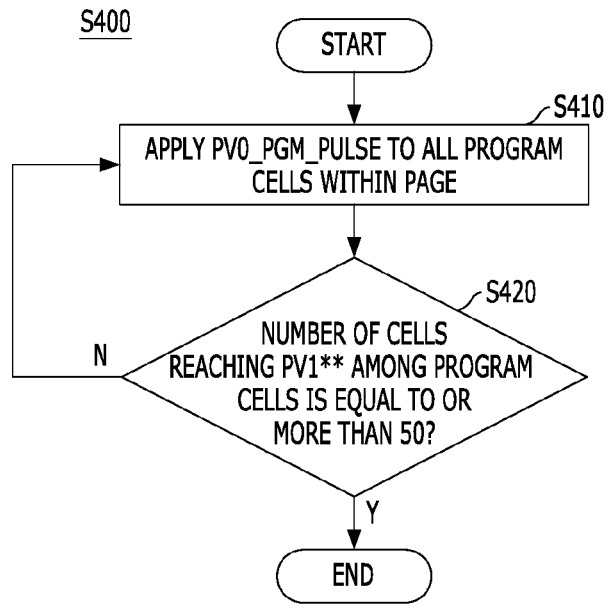
FIG. 4 is a flow chart showing a first slight program S400.

FIG. 4 is a flow chart showing the first slight program S400.

Referring to FIG. 4, the common program pulse PV0_PGM_PULSE is first applied to all program cells within a page, which are to store program data, at step S410. At this time, erase cells within the page, which are to store erase data, that is, which are not to be programmed, are inhibited.

A verification operation is performed to verify whether the threshold voltages of the predetermined number of program cells among the program cells reach the reference threshold voltage level PV1, at step S420. As the verification result, when the number of program cells whose threshold voltages reach the reference threshold voltage level PV1 exceeds the predetermined number (for example, 50), the first slight program is ended. Otherwise, the common program pulse PV0_PGM_PULSE is reapplied to the program cells.

2. Second Slight Program

The second slight program is a program operation which further increases the threshold voltages of the memory cells after the first slight program. The second slight program is not an operation which increases the threshold voltages of the memory cells to the final target threshold voltages PV1, PV2, and PV3. Instead, the second slight program is a program operation for increasing the threshold voltage of a program cell whose target threshold voltage is PV1 to the reference threshold voltage PV1*, increasing the threshold voltage of a program cell whose target threshold voltage is PV2 to the reference threshold voltage PV2*, and increasing the threshold voltage of a program cell whose target threshold voltage is PV3 to the reference threshold voltage PV3*.

The second slight program considers the target threshold voltages of the program cells, different from the first slight program. A program cell having a high target threshold voltage receives a higher program pulse than a program cell having a low target threshold voltage, or in other words, various kinds or a variety of program pulses are applied. For example, during the second slight program, (1) the program pulse PV3_PGM_PULSE is applied to program cells whose target threshold voltage is PV3. (2) The program pulse PV2_PGM_PULSE is applied to program cells whose target threshold voltages are PV2 and PV3 (or only program cells whose target threshold voltages are PV2). (3) The program pulse PV1_PGM_PULSE is applied to program cells whose target threshold voltages are PV1, PV2, and PV3 (or only program cells whose target threshold voltages are PV1), that is, all program cells.

During the second slight program operation, verification is completed when the threshold voltages of at least a predetermined number of program cells among the program cells whose target threshold voltage is PV1 reach the reference threshold voltage PV1*, the threshold voltages of at least a predetermined number of program cells among the program cells whose target threshold voltage is PV2 reach the reference threshold voltage PV2*, and the threshold voltages of at least a predetermined number of program cells among the program cells whose target threshold voltage is PV3 reach the reference threshold voltage PV3*. Alternatively, when the sum of the numbers of memory cells whose threshold voltages reach the reference threshold voltages PV1*, PV2*, and PV3*, respectively, exceeds a predetermined number, the verification may be completed. The predetermined number of cells reaching a reference threshold voltage may correspond to 1/10 or less of the number of memory cells within the page. For example, the predetermined number may be set to one in the range of 1 to 100. During a general program operation, verification is completed only when the threshold voltages of all program cells reach a predetermined target threshold voltage. During the second slight program operation, however, the verification may be completed when the reference threshold voltages of the predetermined number of program cells (for example, 30) reach a reference threshold voltage. The second slight program is not an operation which is to increase the threshold voltages of the program cells to the target threshold voltages, but an operation which slightly increases the threshold voltages of the program cells. Therefore, verification of whether program cells reach a target threshold voltage may be omitted during the second slight program operation.

In order to reduce the operation time of the second slight program, the increasing step of the program pulses PV1_PGM_PULSE, PV2_PGM_PULSE, and PV3_PGM_PULSE may be set to a large value, and when the program pulses PV1_PGM_PULSE, PV2_PGM_PULSE, and PV3_PGM_PULSE are respectively applied several times or more, the second slight program operation may be ended.

That is, the second slight program has the following characteristics. (A) The second slight program is a program operation which slightly increases the threshold voltages of the program cells after the first slight program. (B) Depending on the target threshold voltages of the program cells, the type and/or number of program pulses applied to the program cells may differ. (C) The verification is completed when the threshold voltages of a predetermined number of program cells (for example, 30) among the program cells within the page reach the reference threshold voltages PV1*, PV1*, and PV3*, or, in some embodiments, the verification may be omitted.

Figure 5:
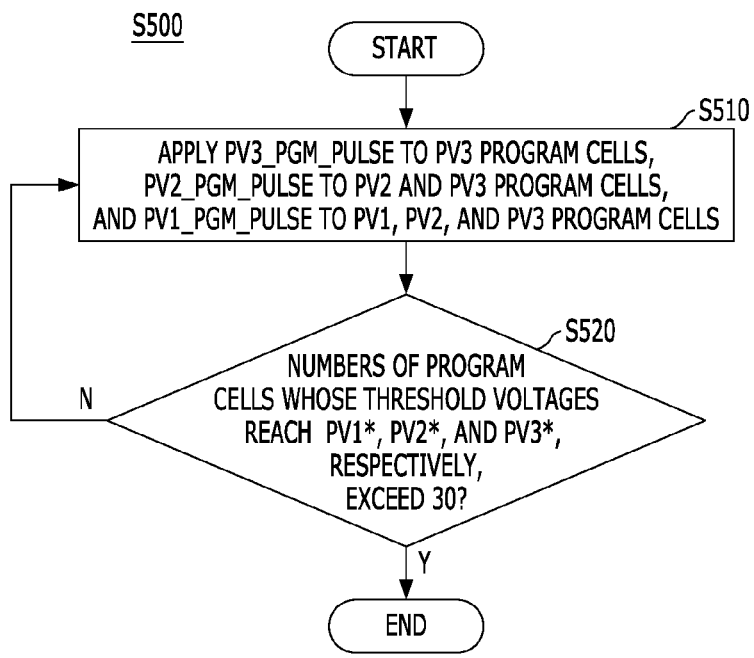
FIG. 5 is a flow chart showing a second slight program S500.

FIG. 5 is a flow chart showing the process of the second slight program S500.

Referring to FIG. 5, the program pulses are applied to the program cells at step S510. (1) The program pulse PV3_PGM_PULSE is applied to the program cells whose target threshold voltages are PV3. (2) The program pulse PV2_PGM_PULSE is applied to the program cells whose target threshold voltages are PV2 and PV3. (3) The program pulse PV1_PGM_PULSE is applied to the program cells whose target threshold voltages are PV1, PV2, and PV3, that is, all the program cells.

The verification operation is performed at step S520. In step S520, it is verified whether the numbers of program cells whose threshold voltages reach PV1*, PV2*, and PV3*, respectively, exceed a predetermined number or not. When the verification is passed, the second slight program is ended. Otherwise, the process returns to the step S510.

3. Exact Program

The exact program is a program operation which increases the threshold voltages of the memory cells to the target threshold voltages after the second slight program. That is, the exact program is performed in the same manner as a general program operation. Since the exact program is an operation which exactly increases the threshold voltages of the memory cells to the target threshold voltages, verification is performed until all the memory cells have reached their own target threshold voltages. In this case, a fail which can be corrected by an error correction algorithm such as an error correction code (ECC) may be allowed.

Figure 6:
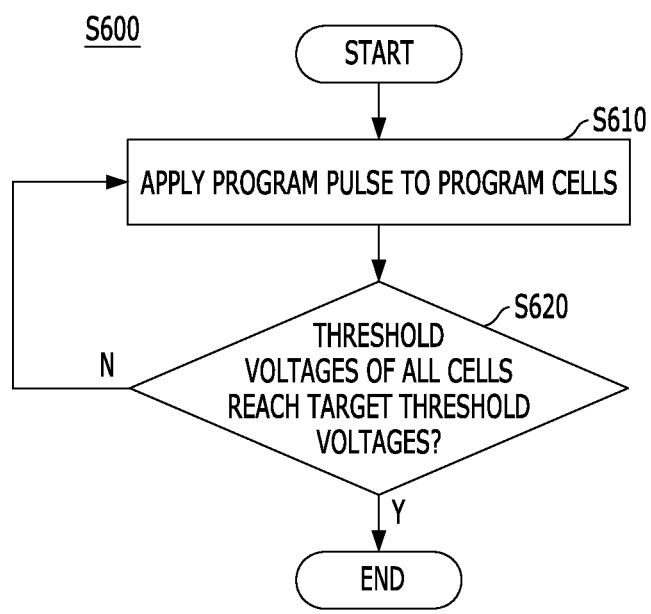
FIG. 6 is a flow chart showing an exact program S600.

FIG. 6 is a flow chart showing the process of the exact program S600.

Referring to FIG. 6, the program pulses are applied to the program cells at step S610. Then, it is verified whether all the program cells have reached their own target threshold voltages, at step S620. When all the program cells have reached their target threshold voltages, the exact program operation is ended. Otherwise, the process returns to the step S610.

FIG. 7 is a table showing a process in which pages within a memory block selected through the first slight program S400, the second slight program S500, and the exact program S600 are programmed. In FIG. 7, numbers indicate program orders.

Before the process of FIG. 7 is performed, a program command and an address are applied to the nonvolatile memory 300 from the memory controller 200. Block-unit program data is stored in the block buffer 330. The block-unit program data stored in the block buffer 330 may be data of a memory block selected by the address. The program data stored in the block buffer 330 is transferred to the page buffer array 320 in page units. For example, while the even page of the word line WL0 is programmed, program data corresponding to the even page of the word line WL0 among the block-unit program data stored in the block buffer 330 is loaded into the page buffer array 320. While the odd page of the word line WL4 is programmed, program data corresponding to the odd page of the word line WL4 among the block-unit program data stored in the block buffer 330 is loaded into the page buffer array 320.

Referring to FIG. 7, the first slight program S400 is performed on all the pages within the memory block. First, the first slight program S400 is performed on the even page of the word line WL0. Second, the first slight program S400 is performed on the odd page of the word line WL0. Third, the first slight program is performed on the even page of the word line WL1. Through such a process, the first slight program S400 is sequentially performed on the even pages and the odd pages of all the word lines WL0 to WL63. The first slight program S400 is performed without considering the target threshold voltages of program cells, and the verification may be simplified or omitted. Therefore, although the first slight program S400 is performed on all the pages within the block, it does not require much time.

After the first slight program S400 is sequentially performed on all the pages, the second slight program S500 is performed. The second slight program S500 is sequentially performed on all the pages within the block, similar to the first slight program S400. In FIG. 7, numbers 128 to 255 indicate an order in which the second slight program S500 is performed. Since the second slight program S500 is performed by considering the different target threshold voltages of the program cells, a larger amount of time is required than in the first slight program S400. However, since the verification is simplified or omitted, it does not require much time even though the second slight program S500 may be performed on all pages within the block.

After the second slight program S500 is sequentially performed on all the pages, the exact program S600 is performed. The exact program S500 is sequentially performed on all the pages within the block. In FIG. 7, numbers 256 to 383 indicate an order in which the exact program S600 is performed. After the exact program S600 is performed on all the pages within the block, all the program cells have their own target threshold voltages. In this case, fail cells having a bit number which may be corrected by an algorithm such as ECC, that is, an allowable bit number or less may occur.

FIG. 7 shows that the first slight program S400, the second slight program S500, and the exact program S600 are sequentially performed on all the pages within the block, but this is only an example. A unit in which the first slight program S400, the second slight program S500, and the exact program S600 are performed may not correspond to the entire pages (128 pages) within the block, but may correspond to a plurality comprising a subset of all the pages the block (for example, 32 pages).

FIG. 8 is a graph showing changes in the threshold voltages of memory cells within even pages of the word line WL0 through the program process as shown in FIG. 7.

Reference numeral 801 indicates the threshold voltage distribution of the memory cells within the pages at the initial stage. Here, it can be seen that all the memory cells within the pages are in an erase state.

Reference numeral 802 indicates the threshold voltage distribution after the first slight program S400 is performed on the even pages of the word line WL0. Here, it can be seen that the threshold voltage distribution of the program cells is shifted right, and the threshold voltages of some program cells reach the reference threshold voltage PV1**.

Reference numeral 803 indicates the threshold voltage distribution of the even pages of the word line WL0, after the first slight program S400 is performed on all the pages. Here, it can be seen that the threshold voltage distribution of the even pages of the word line WL0 becomes wider than the threshold voltage distribution 802, because the first slight program S400 performed on the neighboring pages (pages other than the even pages, i.e. odd pages, of the word line WL0) applies an effect of coupling or interference to the even pages of the word line WL0.

Reference numeral 804 indicates the threshold voltage distribution after the second slight program S500 is performed on the even pages of the word line WL0. Here, it can be seen that the program cells have different threshold voltage distributions, depending on the target threshold voltages. The threshold voltages of some of the program cells whose target threshold voltage is PV1 reach the reference threshold voltage PV1*, the threshold voltages of some of the program cells whose target threshold voltage is PV2 reach the reference threshold voltage PV2*, and the threshold voltages of some of the program cells whose target threshold voltage is PV3 reach the reference threshold voltage PV3*.

Reference numeral 805 indicates the threshold voltage distribution of the even pages of the word line WL0, after the second slight program S500 is performed on all the pages. Here, it can be seen that the threshold voltage distribution of the even pages of the word line WL0 becomes wider than the threshold voltage distribution 804, because the second slight program S500 performed on the neighboring pages (pages other than the even pages of the word line WL0) applies an effect of coupling or interference to the even pages of the word line WL0.

Reference numeral 806 indicates the threshold voltage distribution after the exact program S600 is performed on the even pages of the word line WL0. When the exact program S600 is performed, the program cells of the even pages of the word line WL0 have their own target threshold voltages PV1, PV2, and PV3. In this case, it can be checked that some program cells have threshold voltages which are slightly less than their own target threshold voltages. The number of the program cells is equal to or less than a bit number (i.e., fail cells) which may be corrected by an algorithm such as ECC, that is, an allowable bit number.

Reference numeral 807 indicates the threshold voltage distribution of the even pages of the word line WL0, after the exact program S600 is performed on all the pages. Here, it can be seen that the threshold voltage distribution of the even pages of the word line WL0 becomes wider than the threshold voltage distribution 806, because the exact program S600 performed on the neighboring pages (pages other than the even pages of the word line WL0) applies an effect of coupling or interference to the even pages of the word line WL0. Although the threshold voltage distribution is widened, the threshold voltages of the neighboring pages are not significantly changed during the exact program S600 for the neighboring pages. Therefore, there is little difference between the threshold voltage distributions 807 and 806.

In the program method in accordance with the embodiment of the present invention, the process in which a plurality of pages are programmed sequentially and slightly is repeated, and the program operation is then completed. Therefore, it is possible to minimize the widening of the threshold voltage distribution caused by the coupling or interference between the memory cells.

FIG. 9 is a table showing a program order different from FIG. 7.

Referring to FIG. 9, it can be seen that an order in which the first slight program S400 is performed, an order in which the second slight program S500 is performed, and an order in which the exact program S600 is performed are different from those of FIG. 7. Even in FIG. 9, however, the program for one page is performed in the order of the first slight program S400 followed by the second slight program S500 followed by the exact program S600. Furthermore, an upper-level program operation for the corresponding page is performed after a lower-level program operation for the neighboring pages is completed.

Some Alternate Embodiments

In the above embodiments of the present invention, it has been described that the first slight program S400, the second slight program S500, and the exact program S600 are sequentially performed on the pages. However, one of the first and second programs may be omitted. For example, after the first slight program is sequentially performed on a plurality of pages, the exact program may be sequentially performed on the pages. Alternatively, after the second slight program is sequentially performed on a plurality of pages in a state in which the first slight program is not performed, the exact program may be sequentially performed on the pages.

In accordance with the embodiments of the present invention, the first slight program which applies a common program pulse to a memory cell to be programmed regardless of a target threshold voltage and the second slight program which applies a program pulse by considering the target threshold voltage of a memory cell to be programmed are performed. Since two such kinds of slight program operations are performed, it is possible to prevent a change in threshold voltage caused by coupling or interference between memory cells, while reducing the program time of the memory.

Furthermore, since the verification is omitted in the slight program operations or the slight programs are stopped when only some program cells reach a predetermined threshold voltage, it is possible to minimize an increase of the program time caused by the slight program operations.

While the present invention has been described with respect to the specific embodiments, it will be apparent to those skilled in the art that various changes and modifications may be made without departing from the spirit and scope of the invention as defined in the following claims.

What is claimed is:

1. A method of programming a nonvolatile memory, comprising:
    applying a common program pulse to program cells within each page of a memory region including two or more pages;
    applying one or more different program pulses to the program cells within each page of the memory region, according to target threshold voltages of the program cells; and
    programming each page of the memory region such that the program cells have their own target threshold voltages,
    wherein the applying of the common program pulse is performed until a first number of memory cells among the program cells are programmed to a first threshold voltage or higher, where the first number is 1/10 or less of the number of entire memory cells within each page, and the first threshold voltage is lower than a lowest target threshold voltage among the target threshold voltages.

2. The program method of claim 1, wherein the program cells have reached lower threshold voltages than their own target threshold voltages, after the applying of the common program pulse and the applying of the one or more different program pulses are completed.

3. The program method of claim 1, wherein, in the applying of the one or more different program pulses, a program cell having a high target threshold voltage receives a larger variety of program pulses than a program cell having a low target threshold voltage.

4. The program method of claim 1, wherein, in the applying of the one or more different program pulses, a program cell having a high target threshold voltage receives a higher program pulse than a program cell having a low target threshold voltage.

5. The program method of claim 1, wherein a verification operation is not performed in the applying of the common program pulse and the applying of the one or more different program pulses.

6. The program method of claim 1, wherein the program cells have one of first, second or third target threshold voltages,
the applying of the one or more different program pulses is performed until a second number of program cells among the program cells having the first target threshold voltage are programmed to a second threshold voltage or higher, a third number of program cells among program cells having the second target threshold voltage are programmed to a third threshold voltage or higher, and a fourth number of program cells among program cells having the third target threshold voltage are programmed to a fourth threshold voltage or higher, where the following relations are established: the first threshold voltage≤the second threshold voltage≤the first target threshold voltage, the third threshold voltage≤the second target threshold voltage, the fourth threshold voltage≤the third target threshold voltage, and the first target threshold voltage<the second target threshold voltage<the third target threshold voltage, and
each of the second, third and fourth number of program cells is 1/10 or less of the number of entire memory cells within each page.

7. The program method of claim 1, wherein the memory region comprises a block.

8. A method of programming a nonvolatile memory, comprising:
programming program cells within each page of a region including two or more pages to a lower voltage level than a target threshold voltage; and
programming each page of the region such that the program cells have the target threshold voltage,
wherein the programming of the program cells is performed until a predetermined number of memory cells among the program cells within a page are programmed to a lower voltage level than the target threshold voltage, where the predetermined number is 1/10 or less of the number of entire memory cells within the page.

9. The program method of claim 8, wherein, in the programming of the program cells, a common program pulse is applied to the program cells.

10. The program method of claim 8, wherein, in the programming of the program cells, one or more different program pulses are applied to the program cells depending on target threshold voltages of the program cells.

11. The program method of claim 10, wherein, in the programming of the program cells, a program cell having a high target threshold voltage receives a higher program pulse than a program cell having a low target threshold voltage.

12. The program method of claim 10, wherein, in the programming of the program cells, a program cell having a high target threshold voltage receives a larger variety of program pulses than a program cell having a low target threshold voltage.

13. The program method of claim 8, wherein the region comprises a block.

14. A nonvolatile memory comprising:
a memory block comprising a plurality of pages; and
one or more circuits configured to program the memory block,
wherein the one or more circuits apply a common program pulse to program cells within each of two or more pages within the memory block, apply one or more different program pulses to the program cells within each of the two or more pages depending on target threshold voltages of the program cells, and program the program cells within each of the two or more pages such that the program cells have their own target threshold voltages, and
wherein the application of the common program pulse is performed until a first number of memory cells among the program cells are programmed to a first threshold voltage or higher, where the first number is 1/10 or less of the number of entire memory cells within each page, and the first threshold voltage is lower than a lowest target threshold voltage among the target threshold voltage.

15. The nonvolatile memory of claim 14, further comprising a block buffer configured to temporarily store data which the one or more circuits are to program into the memory block.

16. The nonvolatile memory of claim 14, wherein the one or more circuits comprise:
a page buffer array; and
a control circuit configured to control the page buffer array.

17. A nonvolatile memory comprising:
a memory block comprising a plurality of pages; and
one or more circuits configured to program the memory block,
wherein the one or more circuits program a predetermined number of program cells within each of two or more pages to reach a reference threshold voltage and a target threshold voltage, where the reference threshold voltage is less than the target threshold voltage, and where the predetermined number of cells is 1/10 or less of the number of entire memory cells within the page.

18. The nonvolatile memory of claim 17, further comprising a block buffer configured to temporarily store data which the one or more circuits are to program into the memory block.

19. The nonvolatile memory of claim 17, wherein the one or more circuits comprise:
a page buffer array; and
a control circuit configured to control the page buffer array.

* * * * *